United States Patent
Nishizaki et al.

(10) Patent No.: US 11,571,772 B2
(45) Date of Patent: Feb. 7, 2023

(54) FLUX

(71) Applicant: Senju Metal Industry Co., Ltd., Tokyo (JP)

(72) Inventors: Takahiro Nishizaki, Campbell, CA (US); Takashi Hagiwara, Tochigi (JP); Hiroyoshi Kawasaki, Tokyo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 131 days.

(21) Appl. No.: 16/751,330

(22) Filed: Jan. 24, 2020

(65) Prior Publication Data

US 2020/0156192 A1 May 21, 2020

Related U.S. Application Data

(63) Continuation of application No. 16/070,022, filed as application No. PCT/JP2017/000890 on Jan. 12, 2017, now abandoned.

(30) Foreign Application Priority Data

Jan. 15, 2016 (WO) .................. PCT/JP2016/051108

(51) Int. Cl.
*B23K 35/362* (2006.01)
*B23K 35/36* (2006.01)
*H01L 21/56* (2006.01)
*H01L 23/00* (2006.01)

(52) U.S. Cl.
CPC ........ *B23K 35/362* (2013.01); *B23K 35/3612* (2013.01); *H01L 21/56* (2013.01); *H01L 24/26* (2013.01); *H01L 2924/15311* (2013.01); *H01L 2924/15747* (2013.01)

(58) Field of Classification Search
CPC .......................... B23K 35/362; B23K 35/3612
See application file for complete search history.

(56) References Cited

U.S. PATENT DOCUMENTS 6,467,676 B1    10/2002    Wang

FOREIGN PATENT DOCUMENTS

| | | |
|---|---|---|
| CN | 102039497 A | 5/2011 |
| CN | 102785038 A | 11/2012 |
| CN | 102941420 A | 2/2013 |
| CN | 104175023 A | 12/2014 |
| JP | 3124395 A | 5/1991 |
| JP | 5237688 A | 9/1993 |
| JP | 621625 A | 1/1994 |
| JP | 2001107008 A | 4/2001 |
| JP | 200654467 A | 2/2006 |
| JP | 200783253 A | 4/2007 |
| JP | 2014101553 A | 6/2014 |
| JP | 2014117737 A * | 6/2014 |
| JP | 2014117737 A | 6/2014 |
| JP | 2015160244 A | 9/2015 |
| WO | 2012118074 A1 | 9/2012 |

* cited by examiner

*Primary Examiner* — Weiping Zhu
(74) *Attorney, Agent, or Firm* — The Webb Law Firm

(57) ABSTRACT

Provided is a flux that allows soldering to be performed without requiring a step of removing a Cu-OSP film even with a Cu-OSP processed substrate. This flux containing rosin, an organic acid, a benzimidazole-based compound, and a solvent is characterized in that 30% by mass or more and 70% by mass or less of the rosin, 1% by mass or more and 10% by mass or less of the organic acid, 0.2% by mass or more and 10% by mass or less of the benzimidazole-based compound, and 20% by mass or more and 60% by mass or less of the solvent, wherein the benzimidazole-based compound is composed of at least one of 2-alkylbenzimidazole and a salt of 2-alkylbenzimidazole hydrohalide.

4 Claims, No Drawings

FLUX

CROSS-REFERENCE TO RELATED APPLICATIONS

This application is a continuation of U.S. application Ser. No. 16/070,022, having a filing date of Jan. 12, 2017, which is the United States national phase of International Application No. PCT/JP2017/000890 filed Jan. 12, 2017, and claims priority to International Application No. PCT/JP2016/051108 filed Jan. 15, 2016, the disclosures of which are hereby incorporated in their entirety by reference.

TECHNICAL FIELD

The present invention relates to a flux containing a benzimidazole-based compound.

BACKGROUND TECHNOLOGY

It is necessary for the flux used for soldering to have properties of removing any metal oxide, inhibiting reoxidation when the solder melts, reducing surface tension of the solder and the like. For the flux, a flux containing an activator for removing an oxide film from a metal surface to improve its wettability and base material such as rosin for protecting the activator from heat is used.

As an example of the flux, Patent Document 1 discloses a flux composition for soldering which contains a solvent, an aromatic carboxylic acid and an imidazole compound. Patent Document 2 discloses a flux composition for soldering which contains as an activator a benzimidazole compound having an alkyl group in 2-position.

As an example of using the imidazole compound for surface processing of a printed circuit board, Patent Document 3 discloses a processing method of contacting processing liquid, which contains a first imidazole compound, on a surface of copper or copper alloy of the printed circuit board, and contacting processing liquid, which contains a second imidazole compound, thereon.

In recent years, miniaturization of electronic components to be soldered using the flux has been rapidly advanced. To the electronic components, a ball grid allay (hereinafter, referred to as "BGA"), a back surface of which has electrodes, is applied to cope with narrowing of the connection terminal and/or reduction of mounting area along with the miniaturization. As the electronic components to which BGA is applied, for example, a semiconductor package is exemplified.

For the semiconductor package, for example, a Cu-OSP substrate is used in which Cu electrodes are processed by organic solderability preservative (OSP) processing with water-soluble preflux to inhibit the electrode from being oxidized.

Patent Document 4 discloses an OSP processed substrate and a method of forming a solder ball mounted on the substrate. When mounting surface mount components on the OSP processed substrate, as disclosed in Patent Document 4, a step of removing an OSP film from the substrate is generally required before a step of mounting the solder ball and after the step of removing the OSP film from the substrate, the surface mounted components are soldered on the substrate.

DOCUMENTS FOR PRIOR ART

Patent Documents

Patent Document 1: Japanese Patent Application Publication No. 2015-160244
Patent Document 2: Japanese Patent Application Publication No. H05-237688
Patent Document 3: Japanese Patent Application Publication No. 2014-101553
Patent Document 4: Japanese Patent Application Publication No. 2006-54467

SUMMARY OF THE INVENTION

Problems to be Solved by the Invention

When mounting the solder balls on the Cu-OSP processed substrate, as disclosed in Patent Document 4, the step of removing a Cu-OSP film from the substrate is required. Namely, there has been a problem in the Cu-OSP processed substrate such that excessive one step for removing the Cu-OSP film is required as compared with other steps of soldering the substrate.

This invention solves the above-mentioned problem and has an object to provide a flux which can solder the Cu-OSP processed substrate without requiring a step of removing the Cu-OSP film.

Means for Solving the Problems

Technical means of this invention adapted for solving the above-mentioned problem is as follows:

(1) A flux containing rosin, an organic acid, a benzimidazole-based compound, and a solvent, the flux is characterized in that 30% by mass or more and 70% by mass or less of the rosin; 1% by mass or more and 10% by mass or less of the organic acid; 0.2% by mass or more and 10% by mass or less of the benzimidazole-based compound; and 20% by mass or more and 60% by mass or less of the solvent, wherein the benzimidazole-based compound includes at least one species selected from a group consisting of 2-alkylbenzimidazole and a salt of 2-alkylbenzimidazole hydrohalide.

(2) The flux according to the above-mentioned item (1), characterized in that the flux further contains 5% by mass or less of a salt of amine hydrohalide (excluding the salt of 2-alkylbenzimidazole hydrohalide).

(3) The flux according to the above-mentioned item (1) or (2), characterized in that the flux further contains 5% by mass or less of the imidazole-based compound (a total amount of the imidazole-based compound and the salt of hydrohalogenic acid when containing the imidazole-based compound and the salt of hydrohalogenic acid) wherein an addition amount of the imidazole-based compound is equal to or less than an addition amount of the benzimidazole-based compound.

(4) The flux according to any of the above-mentioned items (1) through (3), characterized I that the flux further contains more than 0% by mass and 10% by mass or less of a thixotropic agent.

Effects of the Invention

By a flux according to this invention, even when the substrate is the Cu-OSP processed one, it is possible to solder the substrate without requiring a step of removing the Cu-OSP. Accordingly, a cost required for soldering could be cut.

EMBODIMENT FOR CARRYING OUT THE INVENTION

The following will describe a flux according to embodiments of this invention. This invention, however, is not limited to the following specific embodiments.

[Examples of Flux Composition]

The flux of the present embodiment contains rosin, an organic acid, a solvent and a benzimidazole-based compound.

30% by mass or more and 70% by mass or less of the rosin is added to protect an activator component from heat and prevent the activator component from volatilizing. As the rosin, for example, hydrogenated rosin, acid-modified rosin, polymerized rosin, rosin ester or the like is used.

1% by mass or more and 10% by mass or less of the organic acid is added as an activator component in the flux. As the organic acid, succinic acid, glutaric acid, adipic acid or the like is used.

More than 0% by mass and 10% by mass or less of the thixotropic agent may be added to give thixotropic property. As the thixotropic agent, higher fatty acid amide, hydrogenated castor oil or the like is exemplified.

20% by mass or more and 60% by mass or less of the solvent is added to dissolve solid contents in the flux. The solvent is selected from generally-known glycol-ether-based compounds. It is preferable that the solvent does not volatilize at a low-temperature range of 120 degrees C. and 150 degrees C., in order to allow the activator to efficiently act. When the solvent volatilizes, fluidity of the flux deteriorates so that it may be difficult to wetly spread out the flux to a portion to be joined. Accordingly, the solvent preferably has 200 degrees C. or more, more preferably 240 degrees C. or more, of a boiling point.

As the benzimidazole-based compound, 0.2% by mass or more and 10% by mass or less of 2-alkylbenzimidazole or a salt of 2-alkylbenzimidazole hydrohalide is used.

As the 2-alkylbenzimidazole, 2-pentylbenzimidazole, 2-octylbenzimidazole, 2-nonylbenzimidazole, 2-(1-ethylpentyl)benzimidazole or the like is exemplified.

2-alkylbenzimidazole in the salt of 2-alkylbenzimidazole hydrohalide is identical to the above-mentioned compounds and as the hydrohalogenic acid, hydrochloric acid, hydrobromic acid, hydriodic acid or the like is exemplified.

To the flux containing the benzimidazole-based compound, another imidazole-based compound may be added. As the addible imidazole-based compound, for example, imidazole, 2-methylimidazole, 2-ethylimidazole, 2-ethyl-4-methylimidazole, 2-phenylimidazole, 4-methyl-2-phenylimidazole, 1-benzil-2-methylimidazole, 1-benzil-2-phenylimidazole or the like is exemplified.

To the flux containing the benzimidazole-based compound, a salt of amine hydrohalide other than the salt of 2-alkylbenzimidazole hydrohalide may be added. As the amine compound in the addible salt of amine hydrohalide, for example, ethylamine, diethylamine, dibutyl amine, isopropylamine, diphenylguanidine, cyclohexyl amine or the like is exemplified. As the hydrohalogenic acid, hydrochloric acid, hydrobromic acid, hydriodic acid or the like is exemplified.

To the flux containing the benzimidazole-based compound, both of the above-mentioned additives may be added. Namely, to the flux containing the benzimidazole-based compound, another imidazole-based compound and a salt of amine hydrohalide excluding the salt of 2-alkylbenzimidazole hydrohalide may be added.

As other additives to the above-mentioned fluxes, for example, an antioxidant, a surface-active agent, an antifoam and/or the like may be suitably added unless it (they) impair(s) any flux property.

EXECUTED EXAMPLES

In the examples, fluxes of the Executed Examples and the Comparison Examples having compositions shown in following Tables were prepared to find out an ingredient of each composition contained in the fluxes and the following overall appearance examination and a wetly-spreading-out examination of the solder were performed. It is to be noted that the fluxes of the Executed Examples and the Comparison Examples contained the rosin, the organic acid, the thixotropic agent and the solvent in the ratios of Tables 1 and 2 but we will not specifically describe them in the following (The numerals in the flux compositions represent % by mass).

The following will describe evaluation methods of examinations.

(I) Regarding Overall Appearance Examination (A) Evaluation Method

Cu-OSP process was first performed on a copper plate having 0.3 mm of a thickness and 30 mm by 30 mm of a dimension. After the Cu-OSP processed copper plate was heated at 250 degrees C. for 30 minutes, it was baked at 175 degrees C. for 12 hours. The fluxes prepared in the ratios shown in each of the Executed Examples and the Comparison Examples in Tables were applied to the Cu-OSP processed copper plates. After the fluxes were applied to the Cu-OSP processed copper plates, the baked copper plates were heated at a heating speed of 2.5 degrees C./second up to a peak of 250 degrees C. and then, cooled to a room temperature. The copper plates were washed by hydrocarbon-based cleaner and their overall appearances were examined whether or not there was any residue around a soldered portion using a magnifying microscope.

(B) Evaluation Criterion

O: Good washability was indicated.

X: There was any residue on the substrate.

There is a possibility in the Cu-OSP processed substrate such that any or both of the Cu-OSP and flux residue remain on the substrate. Any residue of Cu-OSP and any residue such as the flux residue cause contact failure and/or conduction failure. It is possible to suppress contact failure and/or conduction failure by removing the residue from the substrate. It has been determined that the Executed Examples indicating good washability in the overall appearance examination could suitably remove such residue of Cu-OSP and the flux residue without a step of removing Cu-OSP.

(II) Regarding Wetly-Spreading-Out Examination of the Solder (A) Evaluation Method Cu-OSP process was first performed on a copper plate having 0.3 mm of a thickness and 30 mm by 30 mm of a dimension. After the Cu-OSP processed copper plate was heated at 250 degrees C. for 30 minutes, it was baked at 175 degrees C. for 12 hours. The fluxes prepared in the ratios shown in each of the Executed Examples and the Comparison Examples in Tables were applied to the Cu-OSP processed copper plates. Solder balls each having a composition of Sn-3Ag-0.5Cu and a diameter of 500 μm were mounted on each of the flux-applied copper plates. The copper plates were heated at a heating speed of 2.5 degrees C./second up to a peak of 250 degrees C. and then, cooled to a room temperature. The copper plates were washed by hydrocarbon-based cleaner and wetly-spread-out diameters of solder were measured therein.

(B) Evaluation Criterion

O: 1000 μm or more of the wetly-spread-out diameter was indicated.

X: less than 1000 μm of the wetly-spread-out diameter was indicated.

When using a flux having poor wettability, defective soldering such as contact failure or the like is easy to occur while when using a flux having good wettability, defective soldering is hard to occur.

As shown in Table 1, in the Executed Examples, 2-octylbenzimidazole, 2-pentylbenzimidazole, 2-nonylbenzimidazole, 2-(1-ethylpentyl)benzimidazole were selected and added as the 2-alkylbenzimidazole. 2-ethyl-4-methylimidazole, 2-phenylimidazole and 1-benzil-2-methylimidazole were selected as another imidazole-based compound. Diphenylguanidine was selected as another amine compound.

benzimidazole were respectively contained in the Executed Examples 5 and 6. All the above-mentioned Executed Examples 1 through 6 indicated good results in the overall appearance examination and the wetly-spreading-out examination.

0.01% by mass of 2-octylbenzimidazole was contained in the Comparison Example 1. The Comparison Example 1 did not indicate any good results in the overall appearance examination and the wetly-spreading-out examination. 20% by mass of 2-octylbenzimidazole was contained in the Comparison Example 2. The Comparison Example 2 indi-

TABLE 1

| | EXECUTED EXAMPLE 1 | EXECUTED EXAMPLE 2 | EXECUTED EXAMPLE 3 | EXECUTED EXAMPLE 4 | EXECUTED EXAMPLE 5 | EXECUTED EXAMPLE 6 | EXECUTED EXAMPLE 7 | COMPARISON EXAMPLE 1 | COMPARISON EXAMPLE 2 |
|---|---|---|---|---|---|---|---|---|---|
| ROSIN | 50 | 50 | 50 | 50 | 50 | 50 | 50 | 50 | 40 |
| ORGANIC ACID | 6 | 6 | 6 | 6 | 6 | 6 | 6 | 6 | 6 |
| 2-OCTYLBENZIMIDAZOLE | 5 | | | | 0.2 | 10 | 5 | 0.01 | 20 |
| 2-PENTYLBENZIMIDAZOLE | | 5 | | | | | | | |
| 2-NONYLBENZIMIDAZOLE | | | 5 | | | | | | |
| 2-(1-ETHYLPENTYL)BENZIMIDAZOLE | | | | 5 | | | | | |
| 2-ETHYL-4-METHYLIMIDAZOLE | | | | | | | 5 | | |
| 2-PHENYLIMIDAZOLE | | | | | | | | | |
| DIPHENYLGUANIDINE | | | | | | | | | |
| 1-BENZIL-2-METHYLIMDAZOLE | | | | | | | | | |
| THIXOTROPIC AGENT | 7 | 7 | 7 | 7 | 7 | 7 | 7 | 7 | 7 |
| SOLVENT | 32 | 32 | 32 | 32 | 36.8 | 27 | 27 | 36.99 | 27 |
| TOTAL AMOUNT | 100 | 100 | 100 | 100 | 100 | 100 | 100 | 100 | 100 |
| OVERALL APPEARANCE EXAMINATION | ○ | ○ | ○ | ○ | ○ | ○ | ○ | X | X |
| WETLY-SPREADING-OUT EXAMINATION | ○ | ○ | ○ | ○ | ○ | ○ | ○ | X | ○ |

| | COMPARISON EXAMPLE 3 | COMPARISON EXAMPLE 4 | COMPARISON EXAMPLE 5 | COMPARISON EXAMPLE 6 | COMPARISON EXAMPLE 7 | COMPARISON EXAMPLE 8 |
|---|---|---|---|---|---|---|
| ROSIN | 50 | 50 | 50 | 50 | 50 | 50 |
| ORGANIC ACID | 6 | 6 | 6 | 6 | 6 | 6 |
| 2-OCTYLBENZIMIDAZOLE | 5 | | | | | |
| 2-PENTYLBENZIMIDAZOLE | | | | | | |
| 2-NONYLBENZIMIDAZOLE | | | | | | |
| 2-(1-ETHYLPENTYL)BENZIMIDAZOLE | | | | | | |
| 2-ETHYL-4-METHYLIMIDAZOLE | | 5 | | | | |
| 2-PHENYLIMIDAZOLE | 10 | | 5 | | | |
| DIPHENYLGUANIDINE | | | | 5 | | |
| 1-BENZIL-2-METHYLIMDAZOLE | | | | | 5 | |
| THIXOTROPIC AGENT | 7 | 7 | 7 | 7 | 7 | 7 |
| SOLVENT | 22 | 32 | 32 | 32 | 32 | 37 |
| TOTAL AMOUNT | 100 | 100 | 100 | 100 | 100 | 100 |
| OVERALL APPEARANCE EXAMINATION | X | X | X | X | X | X |
| WETLY-SPREADING-OUT EXAMINATION | ○ | ○ | ○ | ○ | ○ | X |

As shown in Table 1, 5% by mass of 2-octylbenzimidazole was contained in the Executed Example 1. 5% by mass of 2-pentylbenzimidazole was contained in the Executed Example 2. 5% by mass of 2-nonylbenzimidazole was contained in the Executed Example 3. 5% by mass of 2-(1-ethylpentyl)benzimidazole was contained in the Executed Example 4. Namely, 5% by mass of 2-alkylbenzimidazole was contained in any of the Executed Example 1 through 4. 0.2% by mass and 10% by mass of 2-octylcated good result in the wetly-spreading-out examination but did not indicate any good results in the overall appearance examination.

5% by mass of 2-octylbenzimidazole and 5% by mass of 2-ethyl-4-methylimidazole were contained in the Executed Example 7. The Executed Example 7 indicated good results in the overall appearance examination and the wetly-spreading-out examination.

5% by mass of 2-octylbenzimidazole and 10% by mass of 2-phenylimidazole were contained in the Comparison Example 3. The Comparison Example 3 indicated good result in the wetly-spreading-out examination but did not indicate any good results in the overall appearance examination.

5% by mass of 2-ethyl-4-methylimidazole was contained in the Comparison Example 4. The Comparison Example 4 indicated good result in the wetly-spreading-out examination but did not indicate any good results in the overall appearance examination. 5% by mass of 2-phenylimidazole was contained in the Comparison Example 5. The Comparison Example 5 indicated good result in the wetly-spreading-out examination but did not indicate any good results in the overall appearance examination. 5% by mass of diphenylguanidine was contained in the Comparison Example 6. The Comparison Example 6 indicated good result in the wetly-spreading-out examination but did not indicate any good results in the overall appearance examination. 5% by mass of 1-benzil-2-methylimidazole was contained in the Comparison Example 7. The Comparison Example 7 indicated good result in the wetly-spreading-out examination but did not indicate any good results in the overall appearance examination.

Only the rosin, the organic acid, the thixotropic agent and the solvent were contained in the Comparison Example 8. The Comparison Example 8 did not indicate any good results in the overall appearance examination and the wetly-spreading-out examination.

As the results of Table 1, the following has been understood.

Since all the Executed Examples 1 through 4 indicated good results in the overall appearance examination and the wetly-spreading-out examination as well as the Comparison Example 8 did not indicate any good result in both examinations, the flux containing 2-alkylbenzimidazole has obtained good results in the overall appearance examination and the wetly-spreading-out examination.

From the results of the Executed Examples 1, 5 and 6 and the Comparison Examples 1 and 2, the flux containing 0.2% by mass or more and 10% by mass or less of 2-octylbenzimidazole has obtained good results in the overall appearance examination and the wetly-spreading-out examination. By combing the results with the above-mentioned results found from the Executed Examples 1 through 4, the flux containing 0.2% by mass or more and 10% by mass or less of 2-alkylbenzimidazole has obtained good results in the overall appearance examination and the wetly-spreading-out examination.

From the results of the Comparison Examples 4 through 7, it is supposed that the flux which does not contain 2-alkylbenzimidazole but contains another imidazole-based compound or amine compound has not obtained any good results in the overall appearance examination.

Further, from the results of the Executed Example 7 and the Comparison Example 3, the flux containing 5% by mass of 2-octylbenzimidazole and 5% by mass of 2-ethyl-4-methylimidazole has obtained good results in the overall appearance examination and the wetly-spreading-out examination but the flux containing 5% by mass of 2-octylbenzimidazole and 10% by mass of 2-phenylimidazole has not obtained any good result in the overall appearance examination. By supposing this together with the results of the Comparison Examples 4 through 7, the imidazole-based compound other than 2-alkylbenzimidazole remains any residue which cannot be washed but it is considered that concurrence use of 2-alkylbenzimidazole enables the residue to be removed to certain extent. It is understood that the reason why the Executed Example 7 obtains good results but the Comparison Example 3 does not obtain any desired results in the overall appearance examination is because an addition amount of 2-phenylimidazole exceeds that of 2-octylbenzimidazole.

Therefore, the flux containing 5% by mass of 2-octylbenzimidazole and 5% by mass or less of imidazole-based compound in which an addition amount of the imidazole-based compound is equal to or less than that of 2-octylbenzimidazole has obtained good results in the overall appearance examination and the wetly-spreading-out examination.

When combining this result with the results found from the Executed Examples 1 through 6 and the Comparison Examples 1 and 2, it is understood that even when adding 5% by mass or less of imidazole-based compound to the flux containing 0.2% by mass or more and 10% by mass or less of 2-alkylbenzimidazole, the flux can obtain good results in the overall appearance examination and the wetly-spreading-out examination. In this moment, it is preferable that an addition amount of the imidazole-based compound is equal to or less than that of 2-alkylbenzimidazole.

Next, an inspection about the flux containing a salt of 2-alkylbenzimidazole hydrohalide was carried out. As shown in Table 2, in the Executed Examples, 2-octylbenzimidazole was selected as the 2-alkylbenzimidazole and added. As the salt of 2-alkylbenzimidazole hydrohalide, a salt of 2-octylbenzimidazole hydrobromic acid was selected. As an example of a salt of amine hydrohalide, a salt of ethyl amine hydrobromic acid and a salt of diphenylguanidine hydrobromic acid were selected. As the imidazole-based compound containing imidazole-based compound and a salt of hydrohalide, a salt of 2-phenylimidazole hydrobromic acid was selected.

TABLE 2

| | EXECUTED EXAMPLE 8 | EXECUTED EXAMPLE 9 | EXECUTED EXAMPLE 10 | EXECUTED EXAMPLE 11 | EXECUTED EXAMPLE 12 | EXECUTED EXAMPLE 13 | EXECUTED EXAMPLE 14 |
|---|---|---|---|---|---|---|---|
| ROSIN | 50 | 50 | 50 | 50 | 50 | 50 | 50 |
| ORGANIC ACID | 6 | 6 | 6 | 6 | 6 | 6 | 6 |
| 2-OCTYLBENZIMIDAZOLE | | | | 5 | 5 | 5 | |
| 2-PENTYLBENZIMIDAZOLE | | | | | | | |
| 2-(1-ETHYLPENTYL) BENZIMIDAZOLE | | | | | | | |
| 2-NONYLBENZIMIDAZOLE | | | | | | | |
| 2-ETHYL-4-METHYLIMIDAZOLE | | | | | | | |
| 2-PHENYLIMIDAZOLE | | | | | | | |

TABLE 2-continued

| | | | | | | | |
|---|---|---|---|---|---|---|---|
| SALT OF 2-OCTYLBENZIMIDAZOLE HYDROBROMIC ACID | 5 | 0.2 | 10 | 5 | | | 5 |
| SALT OF ETHYL AMINE HYDROBROMIC ACID | | | | | 1 | 5 | 1 |
| SALT OF DIPHENYLGUANIDINE HYDROBROMIC ACID | | | | | | | |
| SALT OF 2-PHENYLIMIDAZOLE HYDROBROMIC ACID | | | | | | | |
| THIXOTROPIC AGENT | 7 | 7 | 7 | 7 | 7 | 7 | 7 |
| SOLVENT | 32 | 36.8 | 27 | 27 | 31 | 27 | 31 |
| TOTAL AMOUNT | 100 | 100 | 100 | 100 | 100 | 100 | 100 |
| OVERALL APPEARANCE EXAMINATION | ○ | ○ | ○ | ○ | ○ | ○ | ○ |
| WETLY-SPREADING-OUT EXAMINATION | ○ | ○ | ○ | ○ | ○ | ○ | ○ |

| | EXECUTED EXAMPLE 15 | EXECUTED EXAMPLE 16 | EXECUTED EXAMPLE 17 | COMPARISON EXAMPLE 9 | COMPARISON EXAMPLE 10 |
|---|---|---|---|---|---|
| ROSIN | 50 | 50 | 50 | 50 | 40 |
| ORGANIC ACID | 6 | 6 | 6 | 6 | 6 |
| 2-OCTYLBENZIMIDAZOLE | | | | | |
| 2-PENTYLBENZIMIDAZOLE | | | | | |
| 2-(1-ETHYLPENTYL)BENZIMIDAZOLE | | | | | |
| 2-NONYLBENZIMIDAZOLE | | | | | |
| 2-ETHYL-4-METHYLIMIDAZOLE | | | | | |
| 2-PHENYLIMIDAZOLE | | | | | |
| SALT OF 2-OCTYLBENZIMIDAZOLE HYDROBROMIC ACID | 5 | 5 | 5 | 0.01 | 20 |
| SALT OF ETHYL AMINE HYDROBROMIC ACID | 5 | | | | |
| SALT OF DIPHENYLGUANIDINE HYDROBROMIC ACID | | 1 | | | |
| SALT OF 2-PHENYLIMIDAZOLE HYDROBROMIC ACID | | | 1 | | |
| THIXOTROPIC AGENT | 7 | 7 | 7 | 7 | 7 |
| SOLVENT | 27 | 31 | 31 | 36.99 | 27 |
| TOTAL AMOUNT | 100 | 100 | 100 | 100 | 100 |
| OVERALL APPEARANCE EXAMINATION | ○ | ○ | ○ | X | X |
| WETLY-SPREADING-OUT EXAMINATION | ○ | ○ | ○ | X | ○ |

5% by mass, 0.2% by mass and 10% by mass of a salt of 2-octylbenzimidazole hydrobromic acid were respectively contained in the Executed Examples 8 through 10. All the above-mentioned Executed Examples 8 through 10 indicated good results in the overall appearance examination and the wetly-spreading-out examination.

0.01% by mass and 20% by mass of a salt of 2-octylbenzimidazole hydrobromic acid were respectively contained in the Comparison Examples 9 and 10. The Comparison Example 9 did not indicate any good results in the overall appearance examination and the wetly-spreading-out examination. The Comparison Example 10 indicated good result in the wetly-spreading-out examination but did not indicate any good result in the overall appearance examination.

5% by mass of 2-octylbenzimidazole and 5% by mass of a salt of 2-octylbenzimidazole hydrobromic acid were both contained in the Executed Example 11. The Executed Example 11 indicated good results in the overall appearance examination and the wetly-spreading-out examination.

5% by mass of 2-octylbenzimidazole and 1% by mass of a salt of ethyl amine hydrobromic acid were contained in the Executed Example 12. 5% by mass of 2-octylbenzimidazole and 5% by mass of a salt of ethyl amine hydrobromic acid were contained in the Executed Example 13. 5% by mass of a salt of 2-octylbenzimidazole hydrobromic acid and 1% by mass of a salt of ethyl amine hydrobromic acid were contained in the Executed Example 14. 5% by mass of a salt of 2-octylbenzimidazole hydrobromic acid and 5% by mass of a salt of ethyl amine hydrobromic acid were contained in the Executed Example 15. 5% by mass of a salt of 2-octylbenzimidazole hydrobromic acid and 1% by mass of a salt of diphenylguanidine hydrobromic acid were contained in the Executed Example 16. 5% by mass of a salt of 2-octylbenzimidazole hydrobromic acid and 1% by mass of a salt of 2-phenylimidazole hydrobromic acid were contained in the Executed Example 16. All the Executed Examples 12 through 17 indicated good results in the overall appearance examination and the wetly-spreading-out examination.

From the results of Table 2, the following has been understood.

From the results of the Executed Examples 8 through 10 and the Comparison Examples 9 and 10, the flux containing 0.2% by mass or more and 10% by mass or less of a salt of 2-octylbenzimidazole hydrobromic acid as an example of the salt of 2-alkylbenzimidazole hydrohalide has obtained good results in the overall appearance examination and the wetly-spreading-out examination.

Since the Executed Examples 8 through 10 and the Comparison Examples 9 and 10 obtained the above-mentioned results, in addition to the results of the Executed Examples 1 through 6 and the Comparison Examples 1 and 2, the flux containing 0.2% by mass or more and 10% by mass or less of 2-alkylbenzimidazole or a salt of 2-alkylbenzimidazole hydrohalide has obtained good results in the overall appearance examination and the wetly-spreading-out examination.

From the result of the Executed Example 11, the flux containing a total amount of 10% by mass of 2-octylbenzimidazole and the salt of 2-octylbenzimidazole hydrobromic acid has obtained good results in the overall appearance examination and the wetly-spreading-out examination.

By combining this result and the results of the Executed Examples 1 through 6 and 8 through 13 and the Comparison Examples 1, 2, 9 and 10, it is understood that the flux containing 5% by mass or less of a salt of amine hydrohalide in addition to 0.2% by mass or more and 10% by mass or less of at least one species of 2-alkylbenzimidazole and a salt of 2-alkylbenzimidazole hydrohalide has obtained good results in the overall appearance examination and the wetly-spreading-out examination.

Next, in order to find out preferable ingredients of the rosin, the organic acid, the thixotropic agent and the solvent, the overall appearance examination and the wetly-spreading-out examination which were identical to them of the above-mentioned inspections were carried out on the basis of the ratios shown in Table 3.

TABLE 3

|  | EXECUTED EXAMPLE 18 | EXECUTED EXAMPLE 19 | EXECUTED EXAMPLE 20 | EXECUTED EXAMPLE 21 |
| --- | --- | --- | --- | --- |
| ROSIN | 30 | 40 | 60 | 70 |
| ORGANIC ACID | 2 | 10 | 6 | 1 |
| 2-OCTYLBENZIMIDAZOLE | 3 | 5 | 5 | 2 |
| 2-PENTYLBENZIMIDAZOLE |  |  |  |  |
| 2-(1-ETHYLPENTYL)BENZIMIDAZOLE |  |  |  |  |
| 2-NONYLBENZIMIDAZOLE |  |  |  |  |
| 2-ETHYL-4-METHYLIMIDAZOLE |  |  |  |  |
| 2-PHENYLIMIDAZOLE |  |  |  |  |
| SALT OF 2-OCTYLBENZIMIDAZOLE HYDROBROMIC ACID |  |  |  |  |
| SALT Of ETHYL AMINE HYDROBROMIC ACID |  |  |  |  |
| SALT OF DIPHENYLGUANIDINE HYDROBROMIC ACID |  |  |  |  |
| SALT OF 2-PHENYLIMIDAZOLE HYDROBROMIC ACID |  |  |  |  |
| THIXOTROPIC AGENT | 10 | 7 | 0 | 1 |
| SOLVENT | 55 | 38 | 29 | 26 |
| TOTAL AMOUNT | 100 | 100 | 100 | 100 |
| OVERALL APPEARANCE EXAMINATION | ○ | ○ | ○ | ○ |
| WETLY-SPREADING-OUT EXAMINATION | ○ | ○ | ○ | ○ | acid has obtained good results in the overall appearance examination and the wetly-spreading-out examination.

From this result of this Executed Example 11 and the results of the Executed Examples 1 through 6 and 8 through 10 and the Comparison Examples 1, 2, 9 and 10, it is understood that the flux containing a total amount of 0.2% by mass or more and 10% by mass or less of at least one species of 2-alkylbenzimidazole and a salt of 2-alkylbenzimidazole hydrohalide has obtained good results in the overall appearance examination and the wetly-spreading-out examination.

From the results of the Executed Examples 12 and 13, the flux containing 5% by mass or less of a salt of ethyl amine hydrobromic acid as an example of the salt of amine hydrohalide in addition to 2-octylbenzimidazole has obtained good results in the overall appearance examination and the wetly-spreading-out examination.

From the results of the Executed Examples 14 through 17, the flux containing 5% by mass or less of a salt of ethyl amine hydrobromic acid, a salt of diphenylguanidine hydrobromic acid or a salt of 2-phenylimidazole hydrobromic acid as an example of the salt of amine hydrohalide in addition to 5% by mass of a salt of 2-octylbenzimidazole hydrobromic acid has obtained good results in the overall appearance examination and the wetly-spreading-out examination.

30% by mass of rosin, 2% by mass of an organic acid, 3% by mass of 2-octylbenzimidazole, 10% by mass of a thixotropic agent and 55% by mass of a solvent were contained in the Executed Example 18.

40% by mass of rosin, 10% by mass of an organic acid, 5% by mass of 2-octylbenzimidazole, 7% by mass of a thixotropic agent and 38% by mass of a solvent were contained in the Executed Example 19.

60% by mass of rosin, 6% by mass of an organic acid, 5% by mass of 2-octylbenzimidazole and 29% by mass of a solvent were contained in the Executed Example 20.

70% by mass of rosin, 1% by mass of an organic acid, 2% by mass of 2-octylbenzimidazole, 1% by mass of a thixotropic agent and 26% by mass of a solvent were contained in the Executed Example 21.

Since all the Executed Example 18 through 21 obtained good results in the overall appearance examination and the wetly-spreading-out examination as shown in Table 3, it is understood that the flux containing 2-octylbenzimidazole, 30% by mass or more and 70% by mass or less of the rosin, 1% by mass or more and 10% by mass or less of the organic acid and 20% by mass or more and 60% by mass or less of the solvent has obtained good results in the overall appearance examination and the wetly-spreading-out examination. Further, it is understood that the flux containing 2-octylbenzimidazole, 30% by mass or more and 70% by mass or less of the rosin, 1% by mass or more and 10% by mass or less of the organic acid, more than 0% by mass and 10% by mass or less of the thixotropic agent and 20% by mass or more and 60% by mass or less of the solvent has also obtained good results in the overall appearance examination and the wetly-spreading-out examination.

By summarizing the results of Tables 1 through 3, the following has been understood.

(i) Since all the Executed Examples 1 through 6 and 8 through 10 obtained good results in the overall appearance examination and the wetly-spreading-out examination, the flux containing the rosin, the organic acid, the thixotropic agent and the solvent and also containing a total amount of 0.2% by mass or more and 10% by mass or less of at least one species of 2-alkylbenzimidazole and a salt of 2-alkylbenzimidazole hydrohalide as the benzimidazole-based compound has obtained good results in the overall appearance examination and the wetly-spreading-out examination.

(ii) Since all the Executed Examples 12 through 17 obtained good results in the overall appearance examination and the wetly-spreading-out examination, the flux containing 5% by mass or less of a salt of amine hydrohalide (excluding the salt of 2-alkylbenzimidazole hydrohalide) in addition to the above-mentioned flux (i) has obtained good results in the overall appearance examination and the wetly-spreading-out examination.

(iii) Since the Executed Example 7 obtained good results in the overall appearance examination and the wetly-spreading-out examination, the flux containing 5% by mass or less of imidazole-based compound in addition to the above-mentioned flux (i) or (ii) has obtained good results in the overall appearance examination and the wetly-spreading-out examination. In this moment, from the result of the Comparison Example 3, it is preferable that an addition amount of the imidazole-based compound is equal to or less than that of benzimidazole-based compound. Moreover, at this moment, when containing the imidazole-based compound and a salt of hydrohalide as the imidazole-based compound, it is preferable that the total amount thereof is equal to or less than 5% by mass.

(iv) Since the fluxes of the Executed Examples 1 through 21 contained 30% by mass or more and 70% by mass or less of the rosin, 1% by mass or more and 10% by mass or less of the organic acid and 20% by mass or more and 60% by mass or less of the solvent and obtained good results in the overall appearance examination and the wetly-spreading-out examination, it is understood that a content ratio of the rosin is preferably 30% by mass or more and 70% by mass or less, a content ratio of the organic acid is preferably 1% by mass or more and 10% by mass or less and a content ratio of the solvent is preferably 20% by mass or more and 60% by mass or less. Since good results were obtained in the overall appearance examination and the wetly-spreading-out examination even when containing more than 0% by mass and 10% by mass or less of the thixotropic agent, it is understood that the flux may contain more than 0% by mass and 10% by mass or less of the thixotropic agent.

Further, in the Executed Examples, contents of the rosin, the organic acid, the thixotropic agent and the solvent are not limited to the contents described in the above-mentioned Tables 1 through 3.

After the solder balls were mounted, a color of each of the copper plates was visually confirmed but any discoloration was not seen in each of the copper plates of the Executed Examples. Even when a reflow process was performed in the atmosphere, not inert gas such as nitrogen gas, any discoloration was not seen in each of the copper plates of the Executed Examples. Therefore, it is understood that OSP film processing the copper plate may inhibit any oxidation and the OSP film on only a portion to which the flux is applied may be removed. In addition, the flux of this invention is applicable to a substrate other than the Cu-OSP processed substrate.

INDUSTRIAL APPLICABILITY

The present invention is applicable to a flux used for soldering.

The invention claimed is:

1. A method of mounting a solder ball to an OSP processed substrate for forming an electrode of a ball grid array (BGA), the method comprising:
   applying a flux composition to a surface of the substrate, wherein the flux composition consists of a flux; and
   subsequent to the application of the flux composition, applying the solder ball to the surface of the substrate to which the flux has been applied;
   heating the substrate to form the electrode of the ball grid array (BGA), wherein the electrode is formed from one solder ball,
   wherein the flux comprises:
      30% by mass or more and 70% by mass or less of rosin;
      1% by mass or more and 10% by mass or less of organic acid;
      0.2% by mass or more and 10% by mass or less of a benzimidazole-based compound; and
      20% by mass or more and 60% by mass or less of a solvent,
   wherein the benzimidazole-based compound includes at least one species selected from a group consisting of 2-alkylbenzimidazole and a salt of 2-alkylbenzimidazole hydrohalide, and
   wherein an amount of an imidazole-based compound is 5% by mass or less and is equal to or less than the amount of the benzimidazole-based compound, and
   wherein the solder ball is mounted to the substrate without requiring a step of removing an OSP film from the substrate.

2. The method of claim 1, wherein the flux further contains 5% by mass or less of a salt of amine hydrohalide excluding the salt of 2-alkylbenzimidazole hydrohalide, which is a total amount of the imidazole-based compound and the salt of hydrohalogenic acid when containing the imidazole-based compound and the salt of hydrohalogenic acid.

3. The method of claim 1, wherein the flux further contains more than 0% by mass and 10% by mass or less of a thixotropic agent.

4. The method of claim 1, wherein the solder ball is a Sn—Ag—Cu solder ball.

* * * * *